(12) United States Patent
Gros-Jean et al.

(10) Patent No.: US 8,878,331 B2
(45) Date of Patent: Nov. 4, 2014

(54) METHOD FOR MANUFACTURING INSULATED-GATE MOS TRANSISTORS

(71) Applicant: STMicroelectronics (Crolles 2) SAS, Crolles (FR)

(72) Inventors: Mickael Gros-Jean, Grenoble (FR); Clement Gaumer, Seyssinet Pariset (FR); Emmanuel Bayard Perrin, Bernin (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 0 days.

(21) Appl. No.: 13/659,771

(22) Filed: Oct. 24, 2012

(65) Prior Publication Data

US 2013/0099329 A1    Apr. 25, 2013

(30) Foreign Application Priority Data

Oct. 25, 2011  (FR) ...................... 11 59660

(51) Int. Cl.
| H01L 29/02 | (2006.01) |
| H01L 21/70 | (2006.01) |
| H01L 21/28 | (2006.01) |
| H01L 29/51 | (2006.01) |
| H01L 21/762 | (2006.01) |
| H01L 21/8234 | (2006.01) |

(52) U.S. Cl.
CPC .... *H01L 21/76232* (2013.01); *H01L 21/28229* (2013.01); *H01L 29/518* (2013.01); *H01L 21/823481* (2013.01); *H01L 29/513* (2013.01)
USPC .......................................... 257/496; 257/510

(58) Field of Classification Search
USPC .................................. 257/402, 411, 496, 510
See application file for complete search history.

(56) References Cited

U.S. PATENT DOCUMENTS

| 6,146,970 | A  | * | 11/2000 | Witek et al. ................... 438/424 |
| 6,258,695 | B1 |   | 7/2001  | Dunn et al. |
| 6,514,833 | B1 | * | 2/2003  | Ishida et al. .................. 438/424 |
| 6,579,801 | B1 |   | 6/2003  | Dakshina-Murthy et al. |
| 7,022,583 | B1 |   | 4/2006  | Leng et al. |
| 7,087,531 | B1 | * | 8/2006  | Furukawa et al. ............ 438/704 |
| 2001/0001723 | A1 |  | 5/2001  | Gardner et al. |
| 2001/0009805 | A1 |  | 7/2001  | Ha et al. |
| 2002/0004282 | A1 |  | 1/2002  | Hong |
| 2002/0014677 | A1 |  | 2/2002  | Han et al. |
| 2002/0027286 | A1 | * | 3/2002  | Sundararajan et al. ....... 257/751 |
| 2002/0119666 | A1 |  | 8/2002  | Kim et al. |
| 2002/0187609 | A1 | * | 12/2002 | Kim et al. ..................... 438/257 |
| 2004/0212035 | A1 |  | 10/2004 | Yeo et al. |
| 2005/0164457 | A1 | * | 7/2005  | Kim et al. ..................... 438/287 |
| 2006/0151824 | A1 | * | 7/2006  | Lee et al. ...................... 257/315 |

(Continued)

FOREIGN PATENT DOCUMENTS

EP          0725440 A2 *  1/1996

*Primary Examiner* — Karen Kusumakar
(74) *Attorney, Agent, or Firm* — Seed IP Law Group PLLC

(57) ABSTRACT

A method for defining an insulator in a semiconductor substrate includes forming a trench in the substrate, forming in the trench an insulating material having its upper surface arranged above the surface of the substrate, and forming a diffusion barrier layer in a portion of the insulating material located above the surface of the semiconductor substrate. Such insulators can be used, for example, to insulate and delineate electronic components or portions of components formed in the substrate.

18 Claims, 5 Drawing Sheets

(56) References Cited

U.S. PATENT DOCUMENTS

| | | |
|---|---|---|
| 2008/0090379 A1* | 4/2008 | Buehrer et al. ............... 438/435 |
| 2008/0308865 A1 | 12/2008 | Wang et al. |
| 2009/0011564 A1 | 1/2009 | Chen |
| 2009/0042359 A1 | 2/2009 | Lindsay et al. |
| 2009/0130818 A1* | 5/2009 | Lin ............................... 438/424 |
| 2010/0052094 A1* | 3/2010 | Carter et al. .................. 257/510 |
| 2010/0164000 A1* | 7/2010 | Dove ............................ 257/368 |
| 2010/0304548 A1* | 12/2010 | Turner et al. ................. 438/435 |
| 2011/0049596 A1* | 3/2011 | Lee et al. ...................... 257/296 |
| 2011/0175171 A1 | 7/2011 | Nam |

* cited by examiner

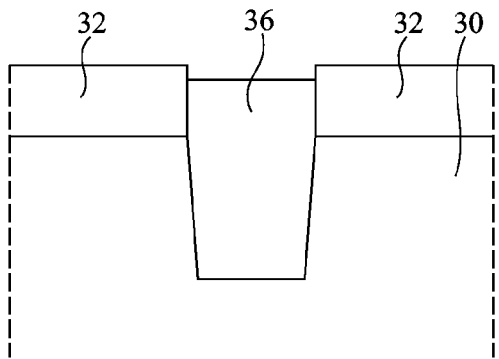
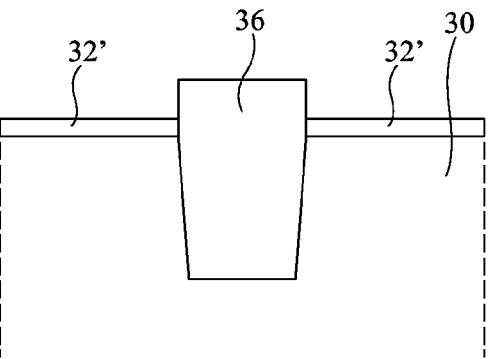
FIG. 5A   FIG. 5B
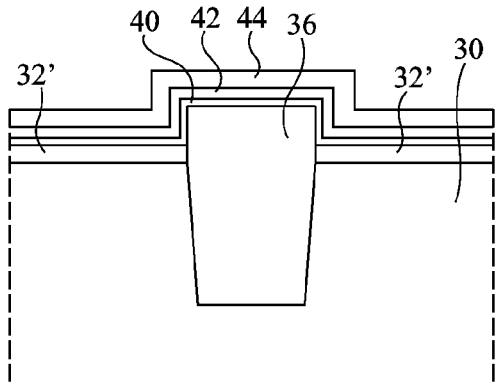
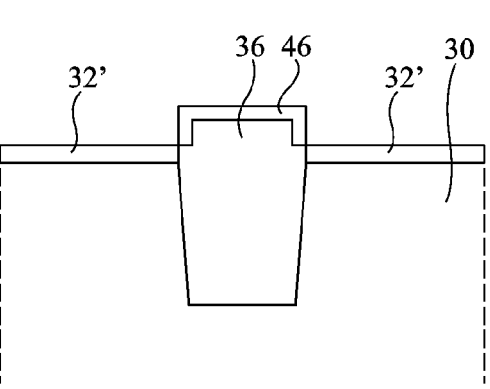
FIG. 5C   FIG. 5D
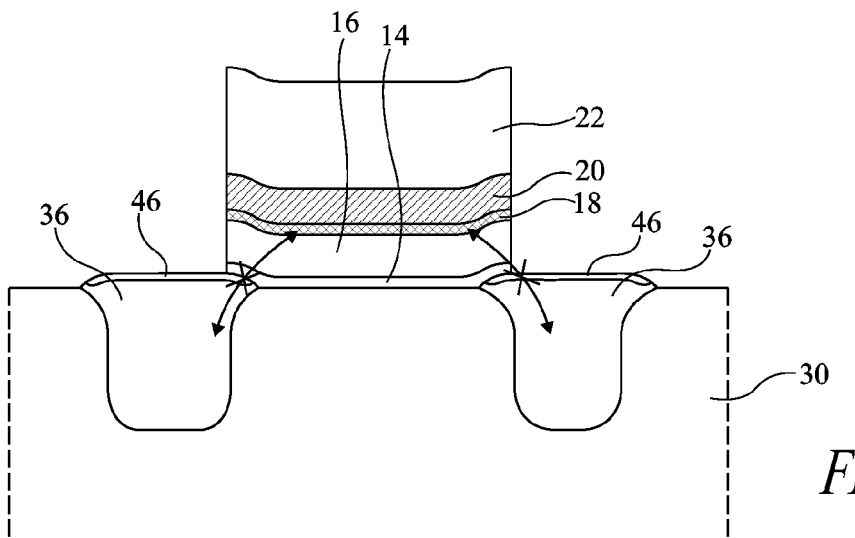
FIG. 5E

METHOD FOR MANUFACTURING INSULATED-GATE MOS TRANSISTORS

BACKGROUND

1. Technical Field

The present disclosure relates to structures of insulated-gate transistors, for example, MOS transistors. More specifically, the present disclosure relates to a method for manufacturing such a transistor providing a step of adjustment of the transistor threshold voltage.

2. Description of the Related Art

Many MOS transistors manufacturing methods are known. To decrease transistor dimensions, it has been provided to replace the gate insulator of the MOS transistors with insulators of high dielectric constant. It has also been provided to adjust the threshold voltage of such transistors, at the end of the manufacturing of their insulated gates, by performing a controlled anneal, which enables the diffusion of atoms modifying this threshold voltage.

FIG. 1 schematically illustrates such a method. In the upper portion of a semiconductor substrate 10 are formed insulating trenches 12 which enable to insulate the different electronic components formed at the surface of substrate 10 from one another. For example, in the case of MOS transistors, trenches 12 delimit the channel regions of the transistors.

Trenches 12 generally are trenches known as "STI", for Shallow Trench Isolation, formed of silicon oxide. In practice, the insulating trenches are formed by etching of the upper surface of semiconductor substrate 10 and deposition of an insulating material in the openings defined by etching. A polishing, for example, a chemical-mechanical polishing (CMP), is then performed to only leave the insulating material in the openings.

Insulated gate T of a MOS transistor, formed at the surface of a channel region delimited by trenches 12, comprises a stack of several insulating layers, topped with several conductive layers.

In the shown example, this gate comprises a stack of a first insulating layer 14, of a second heavily-insulating layer 16, of a layer 18 of a material having atoms capable of diffusing towards the insulating material, of a layer of a conductive material 20, and of an upper conductive layer 22 on which is taken the transistor gate contact.

Conventionally, first insulating layer 14, as close as possible to semiconductor substrate 10, is made of silicon oxide or of silicon oxynitride. This layer is provided to obtain a good interface with the semiconductor material of substrate 10, and generally has a small thickness, on the order of one nanometer. Heavily-insulating layer 16 is made of a material having a high dielectric constant (known as "high-K"). Among such high-K materials, hafnium oxide ($HfO_2$) or hafnium oxynitride (HfSiON) can for example be mentioned. Other high-K alloys are known.

Layer 18 performs a specific function to adjust the transistor threshold voltage. This layer may for example be made of lanthanum, of aluminum, of magnesium, of dysprosium, or more generally of a material from the category of rare earths, or of an alloy comprising one or several of these materials. When the structure is annealed, lanthanum, aluminum, magnesium, dysprosium atoms of layer 18 diffuse towards the interface between insulating layers 14 and 16 to form a silicate, for example, a lanthanum silicate. This diffusion enables to adjust the transistor threshold voltage, since the material having diffused generates dipoles at the interface between layers 14 and 16, which modify this threshold voltage. The threshold voltage adjustment depends on the thickness of diffusion layer 18, on the anneal duration and temperature of the structure.

The upper layers 20 and 22 of the insulated gate are layers conventional in the forming of MOS transistors, and will not be detailed any further herein. As an example, layer 20 may be made of a metal such as titanium nitride and layer 22 may be made of polysilicon.

In the case of an association of MOS transistors of different types on a same substrate, different gate structures are generally provided for these transistors, the diffusing layer being placed in the gate stack at different levels for a proper adjustment of the threshold voltage.

BRIEF SUMMARY

An embodiment provides a method for manufacturing insulated-gate transistors.

More specifically, an embodiment provides a method for manufacturing insulated-gate transistors having a threshold voltage adjustable during the manufacturing, while limiting unwanted diffusion phenomena, this method providing the forming of specific insulating trenches.

Thus, an embodiment provides a method for defining an insulating layer in a semiconductor substrate, including forming a trench in the substrate, forming in the trench an insulating material having its upper surface arranged above the surface of the substrate, and forming, in a portion of the insulating material located above the surface of the semiconductor substrate, a diffusion barrier layer.

According to an embodiment, the method comprises defining a mask at the surface of the substrate having an opening in front of the trench.

According to an embodiment, the insulating material is silicon oxide.

According to an embodiment, the diffusion barrier layer is made of silicon carboxide.

According to an embodiment, forming the diffusion barrier layer includes depositing a stack having a carbon layer, a layer capable of providing oxygen atoms, and an encapsulation layer, followed by an anneal step.

According to an embodiment, deposition of the stack is preceded by etching the mask to decrease its thickness.

According to an embodiment, the layer capable of providing oxygen atoms is a titanium nitride or titanium layer, and the encapsulation layer is a silicon layer.

According to an embodiment, the diffusion barrier layer is formed by implanting carbon atoms in the insulating material.

According to an embodiment, implanting carbon atoms is preceded by etching a portion of the insulating material to decrease its thickness.

An embodiment further provides a device comprising a semiconductor substrate in which is defined at least one insulating area, comprising a diffusion barrier layer which extends, in the insulating area, above the surface of the semiconductor substrate.

An embodiment further provides a MOS transistor formed on a device such as hereabove, further comprising, at the surface of the semiconductor substrate and close to at least one insulating area, a gate comprising at least one first insulating layer of high dielectric constant topped with at least one second layer comprising atoms capable of diffusing towards the first layer.

The foregoing and other features and advantages will be discussed in detail in the following non-limiting description of specific embodiments in connection with the accompanying drawings.

BRIEF DESCRIPTION OF THE SEVERAL VIEWS OF THE DRAWINGS

FIGS. 5A to 5E illustrate results of steps of a method for manufacturing insulating trenches and a MOS transistor according to a second embodiment.

For clarity, the same elements have been designated with the same reference numerals in the different drawings and, further, as usual in the representation of integrated electronic components, the various drawings are not to scale.

DETAILED DESCRIPTION

The method for adjusting the threshold voltage of a MOS transistor by diffusion of diffusing atoms originating from a layer formed above the insulating region of the insulated gate is often of poor efficiency in practice. Indeed, the anneal step enabling the diffusion of the atoms of layer 18 towards the interface between layers 14 and 16 also causes many unwanted diffusions in the structure, which disturb the adjustment.

There thus is a need for a method for forming a MOS transistor with an adjustable threshold voltage during the manufacturing method, limiting unwanted diffusions which disturb this adjustment.

Figure 1:
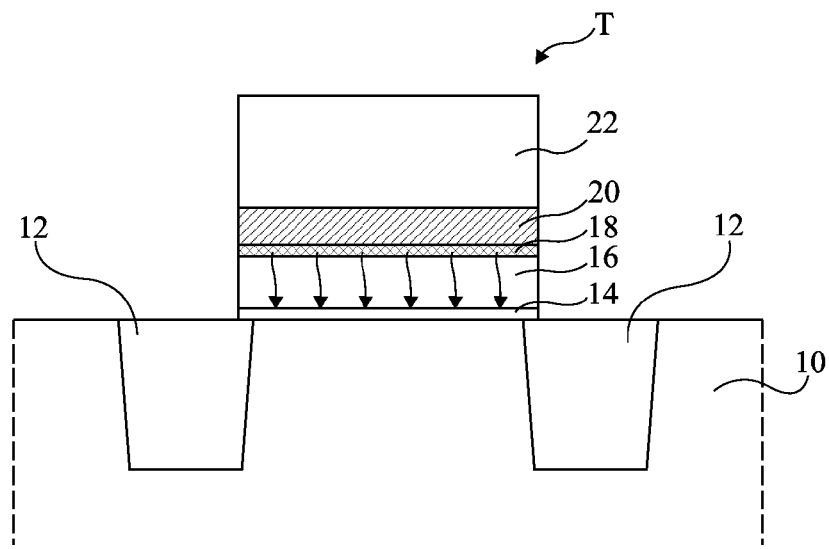
FIG. 1, previously described, illustrates a method for forming a known insulated-gate transistor of adjustable threshold voltage.

The present inventors have noted that, during the diffusion step enabling to adjust the threshold voltage of a MOS transistor such as in FIG. 1, unwanted diffusions occur and cause unwanted variations of this threshold voltage. Such unwanted diffusions are caused by parasitic diffusion agents. In particular, the diffusion is accelerated by the presence of silicon and of oxygen. Indeed, since the forming of a silicate is thermodynamically favorable, areas containing silicon and oxygen, in particular, attract diffusing agents.

Figure 2:
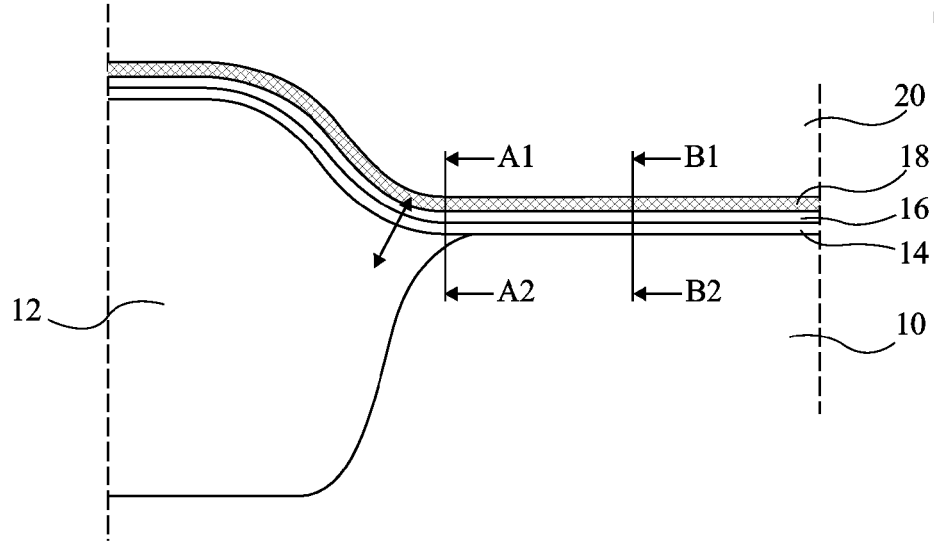
FIGS. 2, 3A, and 3B illustrate a problem of unwanted diffusion which disturbs the adjustment of the threshold voltage of an insulated-gate transistor formed by known methods.
Figure 3A:
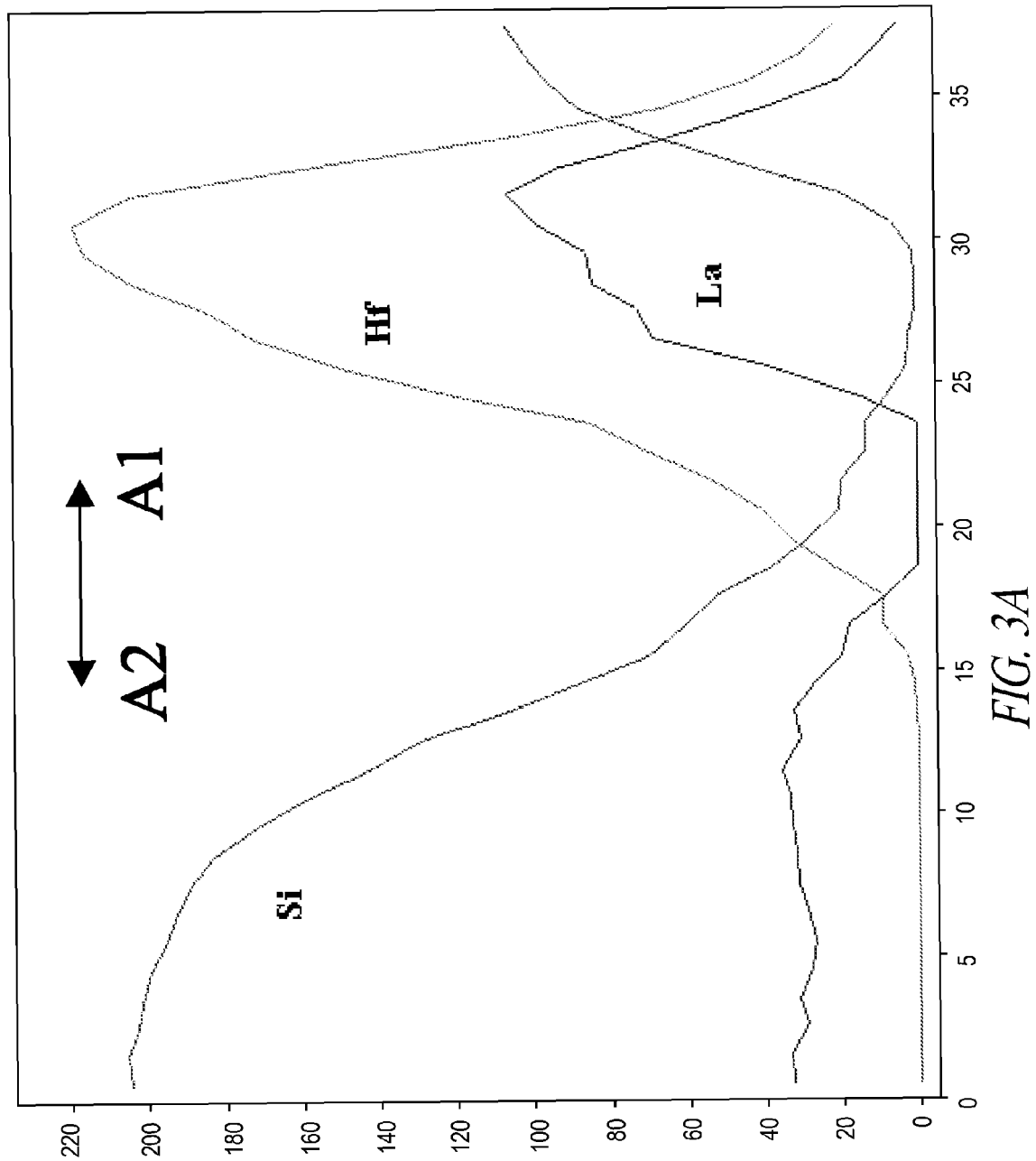
Figure 3B:
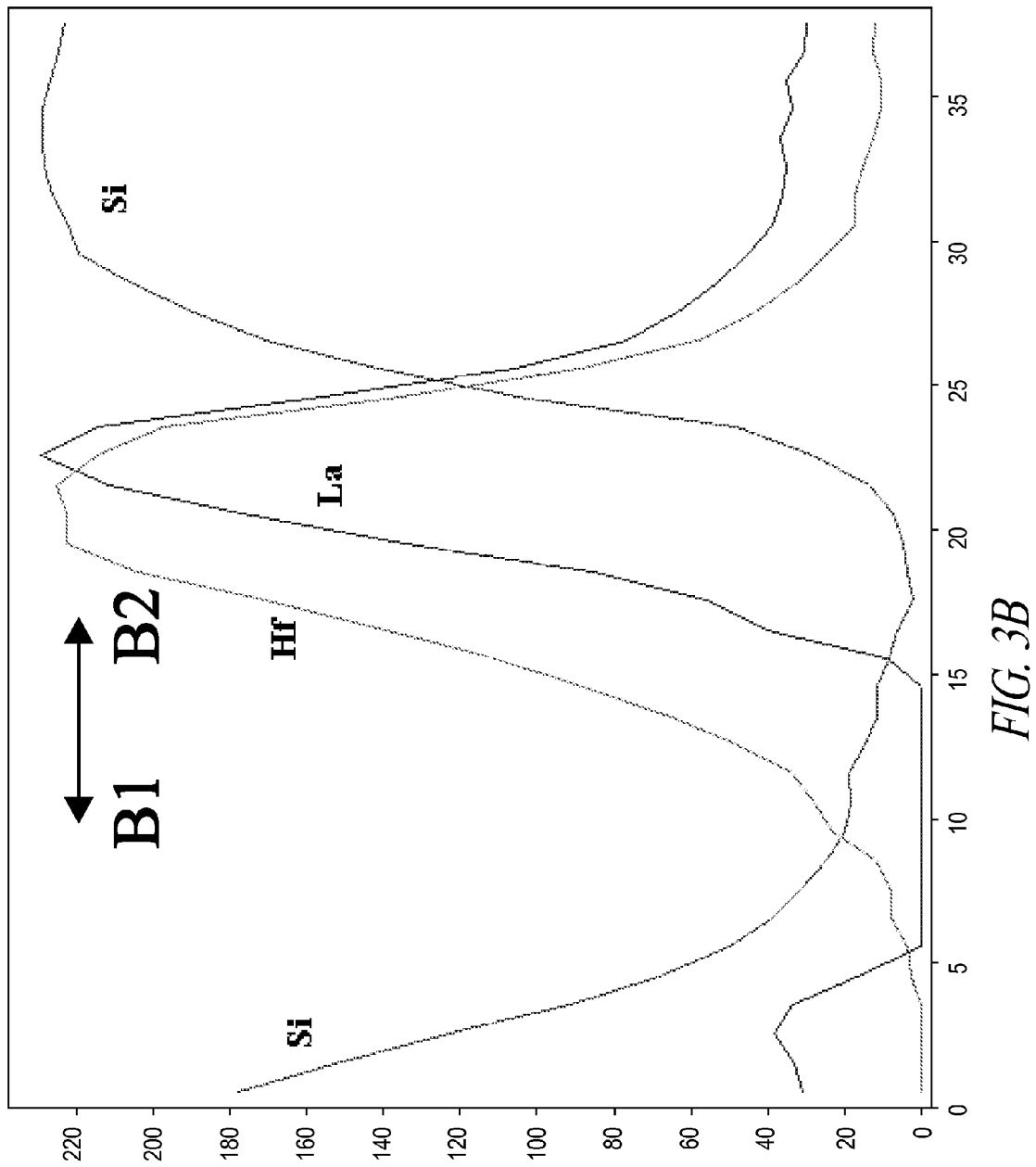

FIGS. 2, 3A, and 3B illustrate a source of such parasitic diffusion agents.

More specifically, FIG. 2 is an enlarged view of the structure of FIG. 1, at the interface between insulated gate T and insulating trenches 12. As illustrated in this drawing, the insulating trenches being in practice bowl-shaped with rounded edges. This shape implies that a region of the gate stack is located in front of thin insulating portions of trenches 12.

FIG. 2 shows two cross-section axes of the gate stack, at A1-A2 and B1-B2. FIGS. 3A and 3B illustrate the distribution of the different materials of this stack along these cross-sections, in the case where layer 16 is made of hafnium oxide, layer 18 comprises lanthanum atoms, and substrate 10 is made of silicon. The first cross-section A1-A2 is formed vertically in front of the edge of insulating trench 12, and the second cross-section B1-B2 is formed vertically on a portion of the gate stack distant from insulating trench 12.

FIGS. 3A and 3B show the silicon (Si), hafnium (Hf), and lanthanum (La) concentrations along cross-section lines A1-A2 and B1-B2, after the anneal step enabling to diffuse lanthanum towards the interface between layers 14 and 16.

As can be seen in the curves, the amount of lanthanum which has diffused at the interface between layers 14 and 16 is smaller at the level of cross-section A1-A2 than at the level of cross-section B1-B2. During the diffusion, a large number of lanthanum atoms which should have been fixed at the interface between layers 14 and 16, have leaked. The migration of the diffusing atoms towards trenches 12 modifies the MOS transistor threshold voltage in unwanted fashion.

Figure 4A:
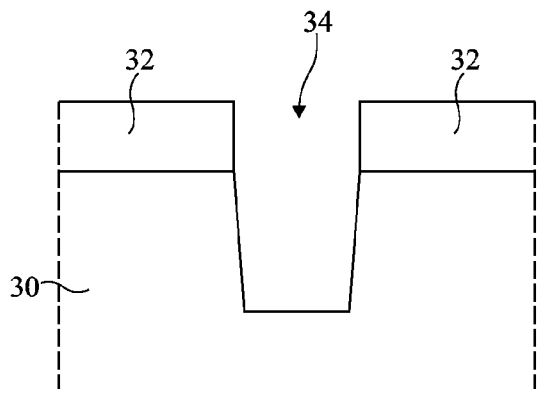
FIGS. 4A to 4E illustrate results of steps of a method for manufacturing insulating trenches and a MOS transistor according to a first embodiment.
Figure 4B:
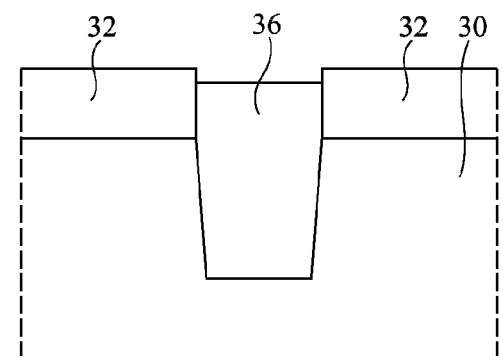
Figure 4C:
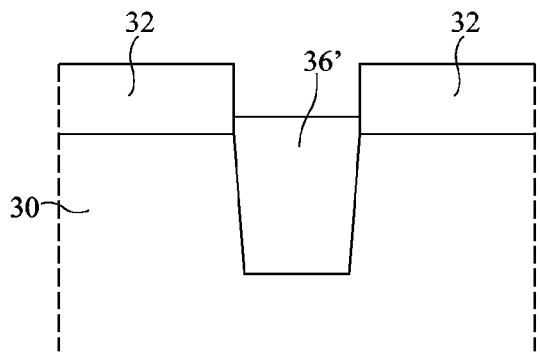
Figure 4D:
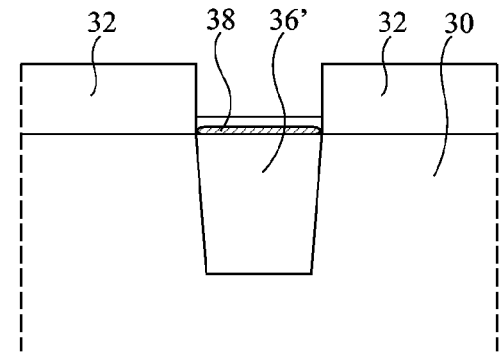
Figure 4E:
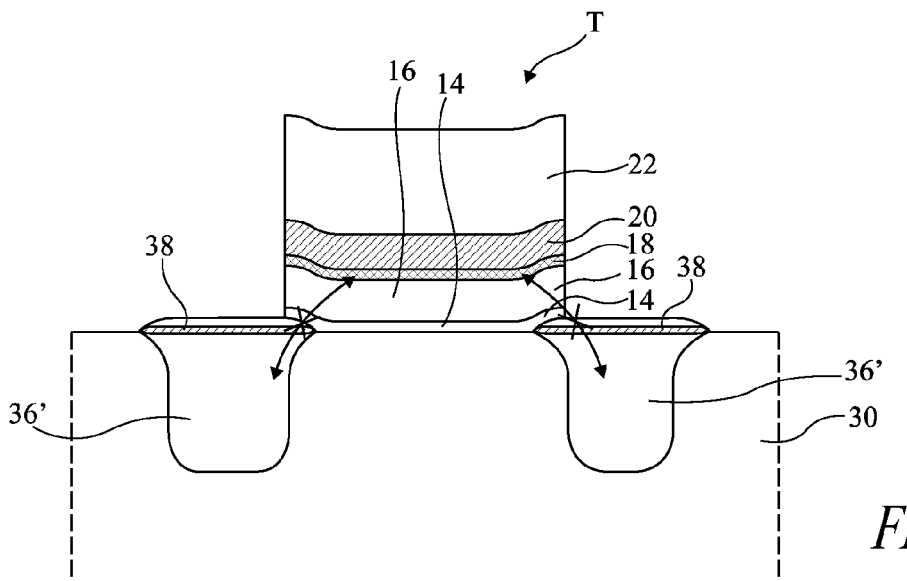

FIGS. 4A to 4E, and 5A to 5E, illustrate results of steps of two variations of a method for manufacturing at least one MOS transistor insulation trench, enabling to limit the above-described unwanted diffusions. FIGS. 4A to 4D and 5A to 5D are simplified drawings of the methods provided herein, and FIGS. 4E and 5E illustrate results obtained in practice by the two methods provided herein.

At the step illustrated in FIG. 4A, it is started from a device comprising a semiconductor substrate 30 on which is formed a mask 32 comprising one or several openings at the level of insulating trenches to be defined in the substrate. As an example, mask 32 may be made of silicon nitride ($Si_3N_4$). An etching has been performed to define a trench 34 in the semiconductor substrate 30, at the level of the openings formed in mask 32.

At the step illustrated in FIG. 4B, opening 34 has been filled with an insulating material. Material 36 may be formed by deposition or by growth on substrate 30. As an example, material 36 may be made of silicon oxide. Due to the deposition or to the growth, the surface of material 36 is located above the surface of semiconductor substrate 30.

At the step illustrated in FIG. 4C, the upper surface of insulating material 36 has been etched so that the resulting material 36' has its surface located above the surface of semiconductor substrate 30, but with a low level difference. This etching may be performed by any known method.

At the step illustrated in FIG. 4D, atoms have been implanted in material 36' to form a barrier layer against the unwanted diffusion. For example, carbon atoms are implanted to form a silicon carboxide layer 38 (SiOC) in material 36'. Layer 38 is parallel to the surface of substrate 30, and is located above the surface of semiconductor substrate 30, at the border thereof.

The carbon atom implantation power is adjusted to obtain this distribution in material 36' and so that the carbon atoms implanted on the portion of the structure protected by the mask do not cross mask 32 and do not penetrate into the upper surface of substrate 30. Indeed, the implantation of carbon atoms in semiconductor substrate 30 is generally not desired, and even less at the level of future active MOS transistor areas, such an implantation altering the operation of the electronic components defined on the substrate.

As an example, the atom implantation power may range between 1 and 10 keV, and the dose of implanted atoms may typically range from $10^{13}$ to $10^{17}$ atoms. Such parameters enable to adjust the implantation depth between 10 and 100 nm.

Thus, the implementation of the steps of FIGS. 4C and 4D implies a monitoring due to the fact that the carbon atoms are implanted in material 36' just above the surface of substrate 30 and are not implanted in substrate 30. It should be noted that the etch step described hereabove in relation with FIG. 4C may be optional if the thickness of mask 32 is sufficient for an implantation in material 36' to cause no implantation in substrate 30, through mask 32.

The step illustrated in FIG. 4E is a final step of the forming of a MOS transistor on substrate 30, comprising trenches defined according to the method of FIGS. 4A to 4D. After having removed mask 32, for example, by chemical etching, layers forming an insulated gate having an adjustable threshold voltage are formed at the surface of the obtained device. In the shown example, gate T formed at the surface of substrate 10 is identical to the gate described in relation with FIG. 1, that is, it comprises a first insulating bonding layer 14, a high-K insulating layer 16, a layer 18 comprising atoms capable of diffusing towards the interface between layers 14 and 16, a first conductive layer 20, and a second conductive layer 22.

It should be noted that, in practice, the insulating trenches are generally bowl-shaped with rounded edges. The method provided herein is more specifically adapted to such a trench configuration. The layers forming gate T partly extend over two trenches 12, thus delimiting the MOS transistor channel region, formed according to the method described in relation with FIGS. 4A to 4D.

Advantageously, the forming of barrier layers 38 in the insulating material of trenches 12 enables to limit unwanted diffusions. Indeed, barrier layers 38 enable to slow down the diffusion of diffusing atoms and of oxygen in the structure (as illustrated by arrows in FIG. 4E), and makes the silicate-forming chemical reaction less favorable.

FIGS. 5A to 5E illustrate results of steps of a variation of a method for manufacturing MOS transistor insulating trenches, enabling to limit unwanted diffusions.

At the step illustrated in FIG. 5A, it is started from a device such as that in FIG. 4B, comprising a semiconductor substrate 30 on which is formed a mask 32 comprising at least one opening at the level of insulating trenches to be defined in substrate 30. An etching has been performed to define a trench in semiconductor substrate 30, at the level of the openings in mask 32, and the trench has been filled with an insulating material 36.

At the step illustrated in FIG. 5B, the upper surface of mask 32 has been etched to thin the mask and only leave a lower portion 32' thereof. This etching is performed so that the upper surface of mask 32' is located under the upper level of insulating material 36.

At the step illustrated in FIG. 5C, a stack of layers for example comprising a first carbon layer 40, a second layer 42 having its atoms forming an oxygen source, for example, a titanium or titanium nitride layer, and a third encapsulation layer 44, for example, made of silicon, have been formed all over the structure of FIG. 5B. As a variation, layer 40 may be a layer of any material comprising carbon atoms, for example, an SiC, SiCN, SiOCN, TaC layer, layer 42 may be made of any material comprising oxygen atoms, for example, titanium oxide or tantalum oxide. It should be noted that encapsulation layer 44 is optional, and may also be made of silicon nitride or silicon oxide.

The structure is then annealed. This anneal combines the oxygen atoms present in layer 42 and the carbon atoms of layer 40 to form carbon monoxide CO, and then combines the formed carbon monoxide with the surface of material 36.

FIG. 5D illustrates the result obtained after this anneal, layers 40, 42, and 44 having been removed. The removal of layers 40, 42, and 44 may be implemented by any known adapted etching, for example, a chemical etching based on TMAH (tetra-methylammonium hydroxide), $N_4OH$ (ammonium hydroxide), or again $HF/HNO_3$ (hydrofluoric acid/nitric acid). The anneal forms, at the surface of material 36 located above mask 32', a silicon carboxide (SiOC) encapsulation layer 46. This layer forms a barrier against parasitic diffusion agents, and thus against diffusion.

At the step illustrated in FIG. 5E, an etching, for example, a chemical etching, has been performed to remove mask 32'. An insulated gate T having a threshold voltage that can be adjusted by anneal has then been formed at the surface of substrate 30. Gate T formed at the surface of substrate 10 is identical to the gate described in relation with FIG. 1, that is, it comprises a first insulating bonding layer 14, a high-K insulating layer 16, a layer 18 comprising atoms capable of diffusing towards the interface between layers 14 and 16, a first conductive layer 20, and a second conductive layer 22.

The layers forming gate T partly extend over two trenches 12, delimiting the MOS transistor channel region, formed according to the method described in relation with FIGS. 5A to 5D.

Advantageously, the forming of SiOC barrier layer 46 at the surface of the insulating material of trenches 12 enables to limit unwanted diffusions (as illustrated by arrows in FIG. 5E). Further, the forming of a barrier layer 46 having edges which do not reach the surface of semiconductor substrate 30 enables to avoid for carbon atoms to propagate in semiconductor substrate 30 and to damage the active area of the MOS transistor.

Thus, the two methods provided herein provide the forming, in the high portion of insulating trenches defined in a semiconductor substrate 30, of a barrier layer 38/46 enabling to limit unwanted diffusions of atoms during the adjustment of the threshold voltage of such MOS transistors.

The methods provided herein thus ensure a diffusion of the atoms of layer 18 towards the interface between layers 14 and 16, which is of good quality and uniform over the entire surface of the insulated gate.

Specific embodiments of the present disclosure have been described. Various alterations and modifications will occur to those skilled in the art. In particular, a specific MOS transistor gate structure T, having a manufacturing method which provides an adjustment of the threshold voltage by an atom diffusion, has been described herein. It should be noted that the methods described herein can be adapted to the forming of insulating trenches in the substrate in relation with any MOS transistor gate structure having a manufacturing process which implies a step of diffusion and adjustment of the threshold voltage.

Various embodiments with different variations have been described hereabove. It should be noted that those skilled in the art may combine various elements of these various embodiments and variations to provide further embodiments, without showing any inventive step. In particular, a combination of the methods of FIGS. 4A to 4E and 5A to 5E is possible, the result of such a method being the obtaining of insulating trenches simultaneously comprising a barrier layer 38 at the surface of substrate 30 in material 32 and a barrier layer 46 at the surface of material 32.

It should be noted that methods enabling the formation of a diffusion barrier layer (38, 46) by implantation of carbon atoms in the trenches have been discussed herein. It should be noted that it may as a variation be provided to perform an implantation of nitride, boron, or phosphorus atoms in the insulating trenches to form the diffusion barrier.

Such alterations, modifications, and improvements are intended to be part of this disclosure, and are within the spirit and the scope of the present disclosure. Accordingly, the foregoing description is by way of example only and is not intended to be limiting.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A method, comprising:
defining an insulating layer in a semiconductor substrate, the defining including:
forming a trench in the substrate;
positioning in the trench an insulating material having an upper surface located above an upper surface of the substrate; and
forming a diffusion barrier layer in a portion of the insulating material located above the surface of the semiconductor substrate, wherein forming the diffusion barrier layer includes:
depositing a stack that includes a carbon layer, a layer capable of providing oxygen atoms, and an encapsulation layer; and
annealing the stack.

2. The method of claim 1, comprising defining a mask on the upper surface of the substrate, the mask having an opening over the trench.

3. The method of claim 1, wherein the positioning the insulating material comprises forming silicon oxide in the trench.

4. The method of claim 1, wherein the forming the diffusion barrier layer comprises forming the diffusion barrier layer of silicon carboxide.

5. The method of claim 1, decreasing a thickness of the mask by etching the mask prior to depositing the stack.

6. The method of claim 1, wherein the layer capable of providing oxygen atoms is a titanium nitride or titanium layer, and the encapsulation layer is a silicon layer.

7. The method of claim 1, wherein forming the diffusion barrier layer comprises implanting carbon atoms in the insulating material.

8. The method of claim 1, further comprising decreasing a thickness of the insulating material by etching a portion of the insulating material.

9. A device, comprising:
a semiconductor substrate;
an insulating area defined in the semiconductor substrate;
a gate for a transistor, the gate being positioned adjacent to the insulating area and including a first insulating layer of high dielectric constant and a second insulating layer having atoms capable of diffusing towards the first layer; and
a diffusion barrier layer on said insulating area and positioned above a plane defined by an upper surface of the semiconductor substrate, at least a portion of the diffusion barrier located between the insulating material and the gate, the diffusion barrier including atoms of an element of one of boron, phosphorus, or carbon.

10. A device, comprising:
a semiconductor substrate;
a trench formed in the semiconductor substrate;
an insulating material positioned in the trench and extending above a plane defined by an upper surface of the semiconductor substrate;
a gate of a transistor, the gate being positioned adjacent to the insulating area and including a first insulating layer of high dielectric constant and a second insulating layer having atoms capable of diffusing towards the first layer; and
a diffusion barrier layer positioned on the insulating material and at least a portion of the diffusion barrier located between the insulating material and the gate, the diffusion barrier including atoms of an element of one of boron, phosphorus, or carbon.

11. The device of claim 10, wherein the gate is positioned on the semiconductor substrate adjacent to the trench.

12. The device of claim 10 wherein the diffusion barrier layer is positioned in a portion of the insulating material extending above the plane.

13. The device of claim 10 wherein the diffusion barrier layer includes atoms of carbon.

14. The device of claim 13 wherein the carbon atoms are constituent elements of silicon carboxide molecules present in the insulating material.

15. The device of claim 9, wherein the diffusion barrier layer is positioned on a portion of the insulating material extending above the plane.

16. A device, comprising:
a semiconductor substrate;
an insulating area defined in the semiconductor substrate;
a diffusion barrier layer located on a portion of said insulating area that is located on a first portion of the insulating area and leaves exposed a second portion of the insulating area, the diffusion barrier being positioned above a plane defined by an upper surface of the semiconductor substrate and without contacting the semiconductor substrate.

17. The device of claim 16 further comprising a gate for a transistor, the gate being positioned adjacent to the insulating area and including a first insulating layer of high dielectric constant and a second layer having atoms capable of diffusing towards the first layer.

18. The device of claim 16 wherein the diffusion barrier includes atoms of an element of one of boron, phosphorus, or carbon.

* * * * *